(12) United States Patent
Su et al.

(10) Patent No.: US 12,040,343 B2
(45) Date of Patent: Jul. 16, 2024

(54) BACKSIDE ILLUMINATED IMAGE SENSOR AND MANUFACTURING METHOD THEREFORE

(71) Applicant: Powerchip Semiconductor Manufacturing Corporation, Hsinchu (TW)

(72) Inventors: Jun-Ming Su, Hsinchu (TW); Chih-Ping Chung, Hsinchu (TW); Ming-Yu Ho, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 348 days.

(21) Appl. No.: 17/458,586

(22) Filed: Aug. 27, 2021

(65) Prior Publication Data

US 2023/0043664 A1 Feb. 9, 2023

(30) Foreign Application Priority Data

Aug. 3, 2021 (TW) .................................. 110128572

(51) Int. Cl.
*H01L 27/00* (2006.01)
*H01L 27/146* (2006.01)

(52) U.S. Cl.
CPC ...... *H01L 27/1464* (2013.01); *H01L 27/1461* (2013.01); *H01L 27/14614* (2013.01); *H01L 27/14621* (2013.01); *H01L 27/14627* (2013.01); *H01L 27/14689* (2013.01)

(58) Field of Classification Search
CPC ............. H01L 27/1464; H01L 27/1461; H01L 27/14612; H01L 27/14614
See application file for complete search history.

(56) References Cited

U.S. PATENT DOCUMENTS

| | | | |
|---|---|---|---|
| 8,101,978 B2 | 1/2012 | Dai et al. | |
| 2013/0307106 A1* | 11/2013 | Egawa | H01L 27/14627 257/E31.127 |
| 2020/0092502 A1* | 3/2020 | Parks | H01L 27/14614 |
| 2021/0193712 A1* | 6/2021 | Huang | H01L 27/14614 |
| 2022/0085110 A1* | 3/2022 | Shigetoshi | H01L 27/14687 |

FOREIGN PATENT DOCUMENTS

| | | |
|---|---|---|
| TW | 201909401 | 3/2019 |
| TW | 202111939 | 3/2021 |
| TW | 202114188 | 4/2021 |

(Continued)

OTHER PUBLICATIONS

"Adjacent". Merriam-Webster.com. 2024. http://www.merriam-webster.com (Jan. 23, 2024). (Year: 2024).*

(Continued)

*Primary Examiner* — Reema Patel
(74) *Attorney, Agent, or Firm* — JCIPRNET

(57) ABSTRACT

A backside illuminated image sensor, including a semiconductor layer, a first gate structure, and a light sensing device, is provided. The semiconductor layer has a first surface and a second surface opposite to each other. The first gate structure is disposed on the second surface. The light sensing device is located in the semiconductor layer. The light sensing device extends from the first surface to the second surface.

9 Claims, 8 Drawing Sheets

(56) References Cited

FOREIGN PATENT DOCUMENTS

| TW | 202127638 | 7/2021 | | |
|----|-----------|--------|---|---|
| TW | 202127648 | 7/2021 | | |
| WO | WO-2020158515 A1 * | 8/2020 | ......... | H01L 21/3205 |

OTHER PUBLICATIONS

"Directly". Merriam-Webster.com. 2024. http://www.merriam-webster.com (Jan. 23, 2024). (Year: 2024).*
"Under". Merriam-Webster.com. 2024. http://www.merriam-webster.com (Jan. 23, 2024). (Year: 2024).*
"Office Action of Taiwan Counterpart Application", issued on Mar. 2, 2022, p. 1-p. 10.

* cited by examiner

BACKSIDE ILLUMINATED IMAGE SENSOR AND MANUFACTURING METHOD THEREFORE

CROSS-REFERENCE TO RELATED APPLICATION

This application claims the priority benefit of Taiwan application serial no. 110128572, filed on Aug. 3, 2021. The entirety of the above-mentioned patent application is hereby incorporated by reference herein and made a part of this specification.

BACKGROUND

Technical Field

The disclosure relates to an image sensor and a manufacturing method thereof, and particularly relates to a backside illuminated (BSI) image sensor and a manufacturing method thereof.

Description of Related Art

Currently, backside illuminated image sensors are widely applied to many modern electronic devices (for example, smart phones, digital cameras, biomedical imaging devices, automatic imaging devices, etc.). However, how to further improve the full well capacity (FWC) and the dynamic range (DR) of the backside illuminated image sensor is the goal of continuous efforts.

SUMMARY

The disclosure provides a backside illuminated image sensor and a manufacturing method thereof, which can improve the full well capacity and the dynamic range, thereby improving the image quality.

The disclosure provides a backside illuminated image sensor including a semiconductor layer, a first gate structure, and a light sensing device. The semiconductor layer has a first surface and a second surface opposite to each other. The first gate structure is disposed on the second surface. The light sensing device is located in the semiconductor layer. The light sensing device extends from the first surface to the second surface.

According to an embodiment of the disclosure, in the backside illuminated image sensor, a portion of the light sensing device may be located on one side of the first gate structure.

According to an embodiment of the disclosure, in the backside illuminated image sensor, a portion of the light sensing device may be located directly under the entire first gate structure.

According to an embodiment of the disclosure, in the backside illuminated image sensor, a portion of the light sensing device may extend from one side of the first gate structure to other side of the first gate structure.

According to an embodiment of the disclosure, in the backside illuminated image sensor, the light sensing device may have a third surface and a fourth surface. The third surface may overlap with the first surface. The fourth surface may overlap with the second surface.

According to an embodiment of the disclosure, the backside illuminated image sensor further includes a second gate structure. The second gate structure is located on the second surface. The first gate structure is located between the second gate structure and the fourth surface.

According to an embodiment of the disclosure, in the backside illuminated image sensor, a portion of the light sensing device may be located directly under the entire first gate structure and the entire second gate structure.

According to an embodiment of the disclosure, in the backside illuminated image sensor, the light sensing device may include a first doped region, a second doped region, and a third doped region. The first doped region is located in the semiconductor layer and is adjacent to the first surface. The second doped region is located in the semiconductor layer and is adjacent to the second surface. The third doped region is located in the semiconductor layer and is connected between the first doped region and the second doped region. The semiconductor layer may be of a first conductivity type. The first doped region, the second doped region, and the third doped region may be of a second conductivity type.

According to an embodiment of the disclosure, in the backside illuminated image sensor, the light sensing device may further include a fourth doped region. The fourth doped region is located in the semiconductor layer and is located between the first doped region and the first surface. The fourth doped region may be of the first conductivity type.

According to an embodiment of the disclosure, in the backside illuminated image sensor, the light sensing device may further include a fourth doped region. The fourth doped region is located in the semiconductor layer and is located between the second doped region and the second surface. The fourth doped region may be of the first conductivity type.

According to an embodiment of the disclosure, in the backside illuminated image sensor, the light sensing device may include a first doped region and a second doped region. The first doped region is located in the semiconductor layer and is adjacent to the first surface. The second doped region is located in the semiconductor layer and is adjacent to the second surface. The second doped region is connected to the first doped region. The semiconductor layer may be of a first conductivity type. The first doped region and the second doped region may be of a second conductivity type.

According to an embodiment of the disclosure, in the backside illuminated image sensor, the light sensing device may further include a third doped region. The third doped region is located in the semiconductor layer and is located between the first doped region and the first surface. The third doped region may be of the first conductivity type.

According to an embodiment of the disclosure, in the backside illuminated image sensor, the light sensing device further includes a third doped region. The third doped region is located in the semiconductor layer and is located between the second doped region and the second surface. The third doped region may be of the first conductivity type.

According to an embodiment of the disclosure, the backside illuminated image sensor may further include a color filter layer and a microlens layer. The color filter layer is disposed on the first surface. The microlens layer is disposed on the color filter layer.

According to an embodiment of the disclosure, in the backside illuminated image sensor, a material of the semiconductor layer includes doped epitaxial silicon.

The disclosure provides a manufacturing method of a backside illuminated image sensor, which includes the following steps. A semiconductor layer is provided. The semiconductor layer has a first surface and a second surface opposite to each other. A first gate structure is formed on the second surface. A light sensing device is formed in the semiconductor layer. The light sensing device extends from the first surface to the second surface.

According to an embodiment of the disclosure, in the manufacturing method of the backside illuminated image sensor, the light sensing device may include a first doped region, a second doped region, and a third doped region. The first doped region is located in the semiconductor layer and is adjacent to the first surface. The second doped region is located in the semiconductor layer and is adjacent to the second surface. The third doped region is located in the semiconductor layer and is connected between the first doped region and the second doped region. The semiconductor layer may be of a first conductivity type. The first doped region, the second doped region, and the third doped region may be of a second conductivity type.

According to an embodiment of the disclosure, in the manufacturing method of the backside illuminated image sensor, a forming method of the semiconductor layer and the first doped region may include the following steps. A substrate is provided. A fourth doped region is formed in the substrate. The fourth doped region may be of the second conductivity type. The semiconductor layer is formed on the substrate. A thermal process is performed to diffuse a dopant in the fourth doped region into the semiconductor layer to form the first doped region.

According to an embodiment of the disclosure, in the manufacturing method of the backside illuminated image sensor, the light sensing device may include a first doped region and a second doped region. The first doped region is located in the semiconductor layer and is adjacent to the first surface. The second doped region is located in the semiconductor layer and is adjacent to the second surface. The second doped region is connected to the first doped region. The semiconductor layer may be of a first conductivity type. The first doped region and the second doped region may be of a second conductivity type.

According to an embodiment of the disclosure, in the manufacturing method of the backside illuminated image sensor, a forming method of the semiconductor layer and the first doped region may include the following steps. A substrate is provided. A third doped region is formed in the substrate. The third doped region may be of the second conductivity type. The semiconductor layer is formed on the substrate. A thermal process is performed to diffuse a dopant in the third doped region into the semiconductor layer to form the first doped region.

Based on the above, in the backside illuminated image sensor and the manufacturing method thereof of the disclosure, since the light sensing device extends from the first surface of the semiconductor layer to the second surface of the semiconductor layer, the area of the light sensing device and the photon collection region can be expanded. In this way, the full well capacity and the dynamic range of the backside illuminated image sensor can be improved, thereby improving the image quality.

In order for the features and advantages of the disclosure to be more comprehensible, the following specific embodiments are described in detail in conjunction with the accompanying drawings.

DETAILED DESCRIPTION OF DISCLOSED EMBODIMENTS

FIG. 1A to FIG. 1H are cross-sectional views of a manufacturing process of a backside illuminated image sensor according to an embodiment of the disclosure.

Figure 1A:
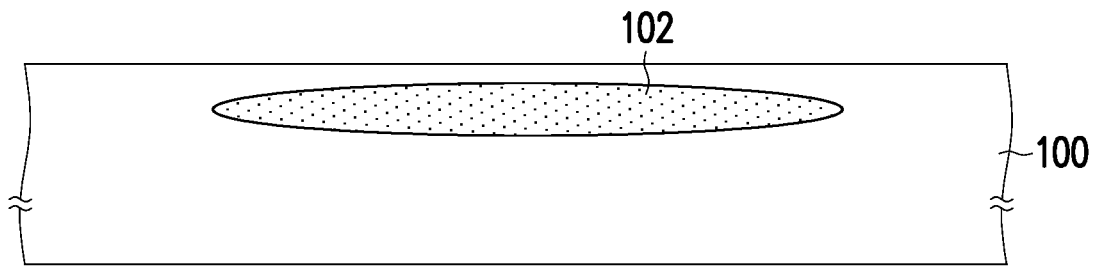
FIG. 1A to FIG. 1H are cross-sectional views of a manufacturing process of a backside illuminated image sensor according to an embodiment of the disclosure.

Please refer to FIG. 1A. A substrate 100 may be provided. In some embodiments, the substrate 100 may be of a first conductivity type (for example, a P type). The substrate 100 may be a semiconductor substrate, such as a silicon substrate. Hereinafter, the first conductivity type and a second conductivity type may respectively be one and the other one of the P type conductivity type and an N type conductivity type. In the embodiment, the first conductivity type is exemplified as the P type conductivity type and the second conductivity type is exemplified as the N type conductivity type, but the disclosure is not limited thereto. In other embodiments, the first conductivity type may be the N type conductivity type and the second conductivity type may be the P type conductivity type.

Next, a doped region 102 may be formed in the substrate 100. The doped region 102 may be of the second conductivity type (for example, the N type). The forming method of the doped region 102 may include an ion implantation method.

Figure 1B:
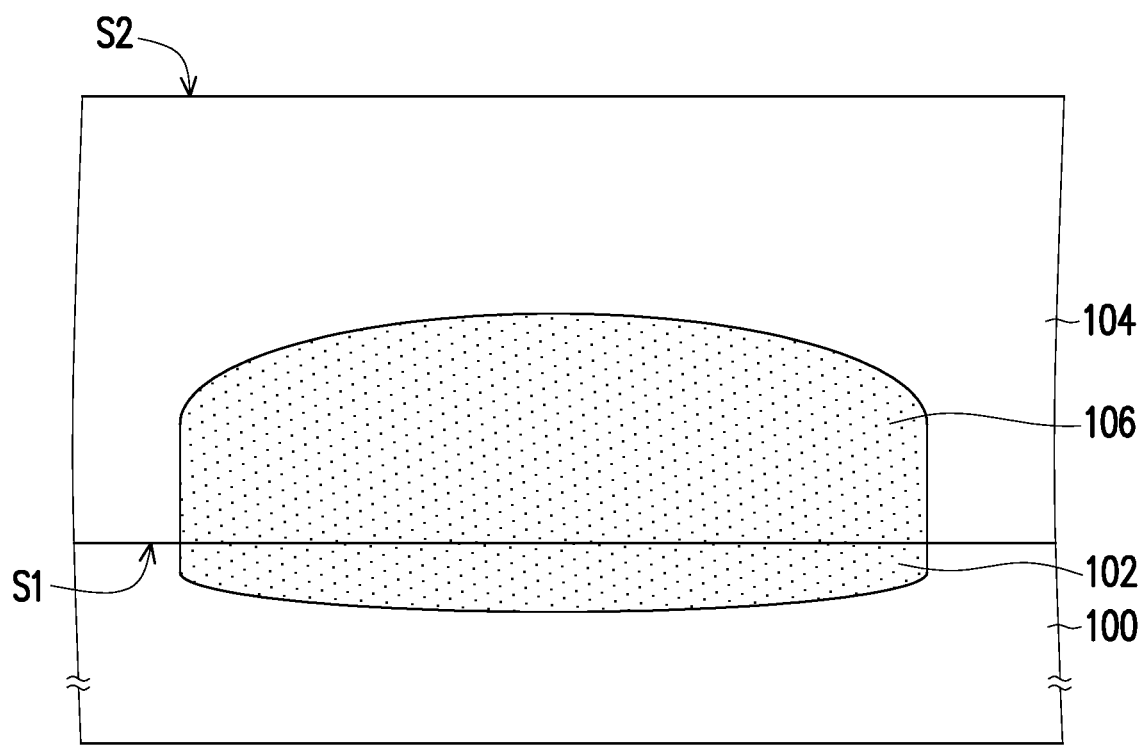

Please refer to FIG. 1B. A semiconductor layer 104 is formed on the substrate 100, so that the semiconductor layer 104 may be provided. The semiconductor layer 104 has a surface S1 and a surface S2 opposite to each other. The semiconductor layer 104 may be of the first conductivity type (for example, the P type). The material of the semiconductor layer 104 is, for example, doped epitaxial silicon. The forming method of the semiconductor layer 104 may include an in situ doped epitaxial growth method.

Then, a thermal process may be performed to diffuse a dopant in the doped region 102 into the semiconductor layer 104 to form a doped region 106. The doped region 106 may be adjacent to the surface S1. The doped region 106 may be of the second conductivity type (for example, the N type). In addition, the thermal process may enable the dopant in the doped region 102 to diffuse in the substrate 100 to expand the range of the doped region 102.

Figure 1C:
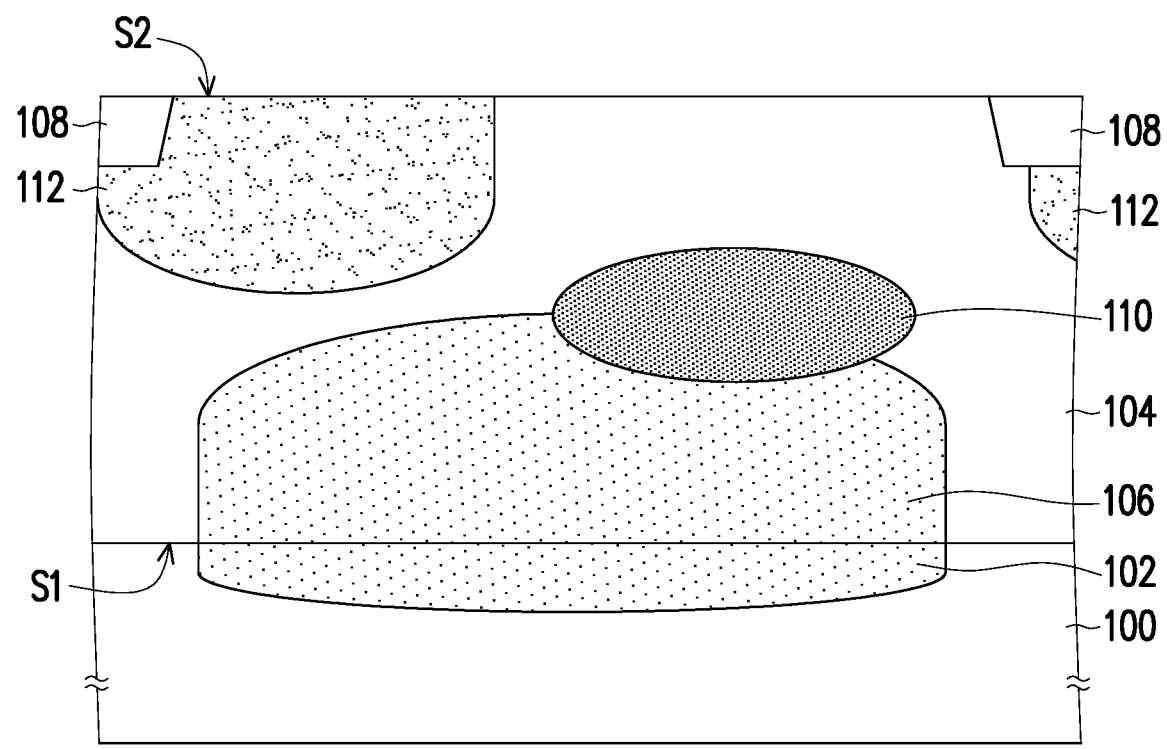

Please refer to FIG. 1C. An isolation structure 108 may be formed in the semiconductor layer 104. The isolation structure 108 is, for example, a shallow trench isolation (STI) structure. The material of the isolation structure 108 is, for example, silicon oxide. The isolation structure 108 may be formed by a shallow trench isolation process.

Next, a doped region 110 may be formed in the semiconductor layer 104. In some embodiments, the doped region 110 may be a deep well region. The doped region 110 may be connected to the doped region 106. The doped region 110 may be of the second conductivity type (for example, the N type). The forming method of the doped region 110 may include an ion implantation method.

In addition, a well region 112 may be formed in the semiconductor layer 104. A portion of the well region 112 may be located under the isolation structure 108. The well region 112 may be of the first conductivity type (for example, the P type). The forming method of the well region 112 may include an ion implantation method.

Figure 1D:
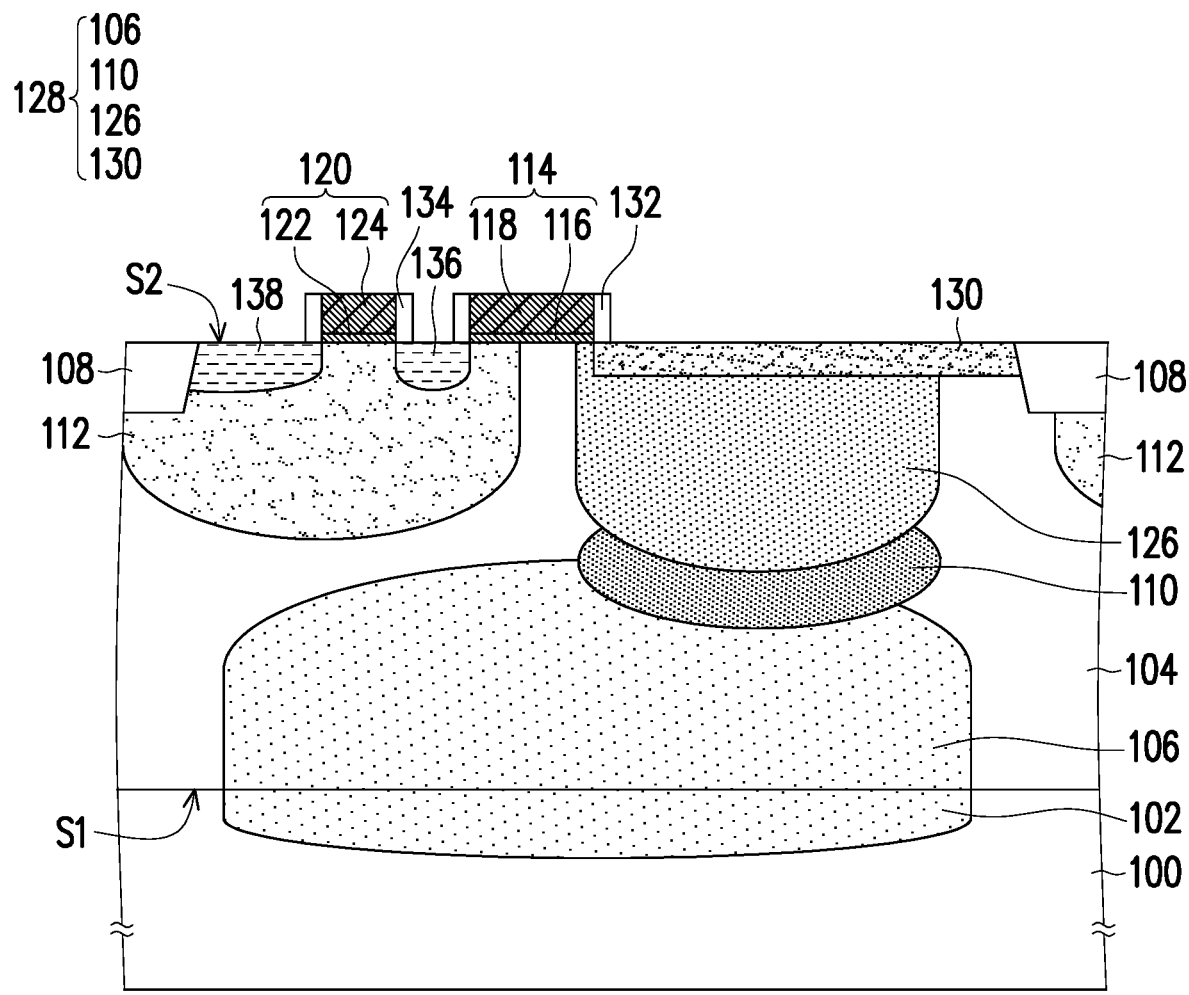

Please refer to FIG. 1D. A gate structure 114 is formed on the surface S2. The gate structure 114 may include a dielectric layer 116 and a gate 118. The dielectric layer 116 is disposed on the surface S2. The dielectric layer 116 may be used as a gate dielectric layer. The material of the dielectric layer 116 is, for example, silicon oxide. The gate 118 is disposed on the dielectric layer 116. The gate 118 may be used as a transfer gate. The material of the gate 118 is, for example, doped polycrystalline silicon. The forming method of the dielectric layer 116 and the gate 118 is to, for example, sequentially form a dielectric material layer (not shown) and a gate material layer (not shown) on the surface S2, and then pattern the gate material layer and the dielectric material layer.

In addition, a gate structure 120 may be formed on the surface S2. The gate structure 120 and the gate structure 114 may be separated from each other. The gate structure 120 may include a dielectric layer 122 and a gate 124. The dielectric layer 122 is disposed on the surface S2. The dielectric layer 122 may be used as a gate dielectric layer. The material of the dielectric layer 122 is, for example, silicon oxide. The gate 124 is disposed on the dielectric layer 122. The gate 124 may be used as a reset gate. The material of the gate 124 is, for example, doped polycrystalline silicon. The forming method of the dielectric layer 122 and the gate 124 is to, for example, sequentially form a dielectric material layer (not shown) and a gate material layer (not shown) on the surface S2, and then pattern the gate material layer and the dielectric material layer. In some embodiments, the gate structure 114 and the gate structure 120 may be simultaneously formed by the same process.

Then, a doped region 126 may be formed in the semiconductor layer 104. The doped region 126 may be adjacent to the surface S2. The doped region 126 may be connected to the doped region 110. The doped region 126 may be of the second conductivity type (for example, the N type). The forming method of the doped region 126 may include an ion implantation method.

By the above method, a light sensing device 128 may be formed in the semiconductor layer 104. In some embodiments, the light sensing device 128 may be an optical diode. The light sensing device 128 extends from the surface S1 to the surface S2, so the area of the light sensing device 128 and a photon collection region can be expanded. In some embodiments, the light sensing device 128 may include the doped region 106, the doped region 110, and the doped region 126.

Next, a doped region 130 may be formed in the semiconductor layer 104. The doped region 130 may be used as a pinning layer. The doped region 130 may be located between the doped region 126 and the surface S2. The doped region 130 may be adjacent to the surface S2. The doped region 130 may be connected to the doped region 126. The doped region 130 may be of the first conductivity type (for example, the P type). The forming method of the doped region 130 may include an ion implantation method. In some embodiments, the light sensing device 128 may further include the doped region 130.

Furthermore, a spacer 132 may be formed on a sidewall of the gate structure 114. In addition, a spacer 134 may be formed on a sidewall of the gate structure 120. The spacer 132 and the spacer 134 may have a single-layer structure or a multi-layer structure. The materials of the spacer 132 and the spacer 134 are, for example, silicon oxide, silicon nitride, or a combination thereof. The forming method of the spacer 132 and the spacer 134 is to, for example, first conformably form a spacer material layer (not shown) on the gate structure 114 and the gate structure 120, and then perform a dry etching process on the spacer material layer.

Subsequently, a doped region 136 may be formed in the semiconductor layer 104 between the gate structure 114 and the gate structure 120. The doped region 136 may be located in the well region 112. The doped region 136 may be of the second conductivity type (for example, the N type). The forming method of the doped region 136 may include an ion implantation method.

In addition, a doped region 138 may be formed in the semiconductor layer 104 on one side of the gate structure 120. The doped region 138 may be located in the well region 112. The doped region 138 may be of the second conductivity type (for example, the N type). The forming method of the doped region 138 may include an ion implantation method.

Figure 1E:
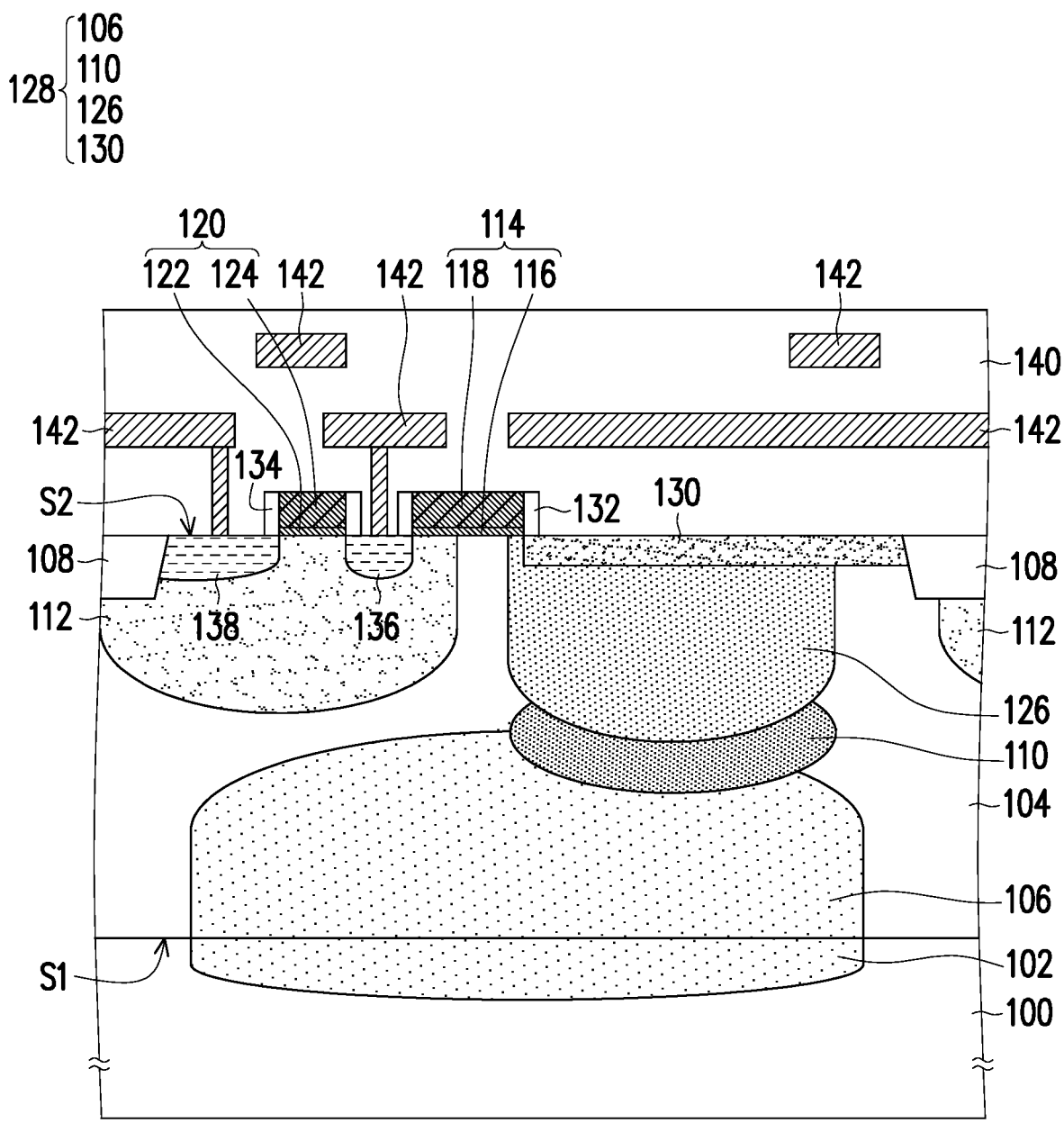

Please refer to FIG. 1E. A dielectric layer 140 may be formed on the semiconductor layer 104. In some embodiments, the dielectric layer 140 may have a multi-layer structure. The material of the dielectric layer 140 is, for example, silicon oxide, silicon nitride, silicon oxynitride, or a combination thereof. In addition, an interconnect structure 142 may be formed in the dielectric layer 140. A portion of the interconnect structure 142 may be electrically connected to the doped region 136, and a portion of the interconnect structure 142 may be electrically connected to the doped region 138. The interconnect structure 142 may include a conductive wire, a conductive plug (for example, a contact or a via), or a combination thereof. The dielectric layer 140 and the interconnect structure 142 may be formed by a back end of line (BEOL) process.

Figure 1F:
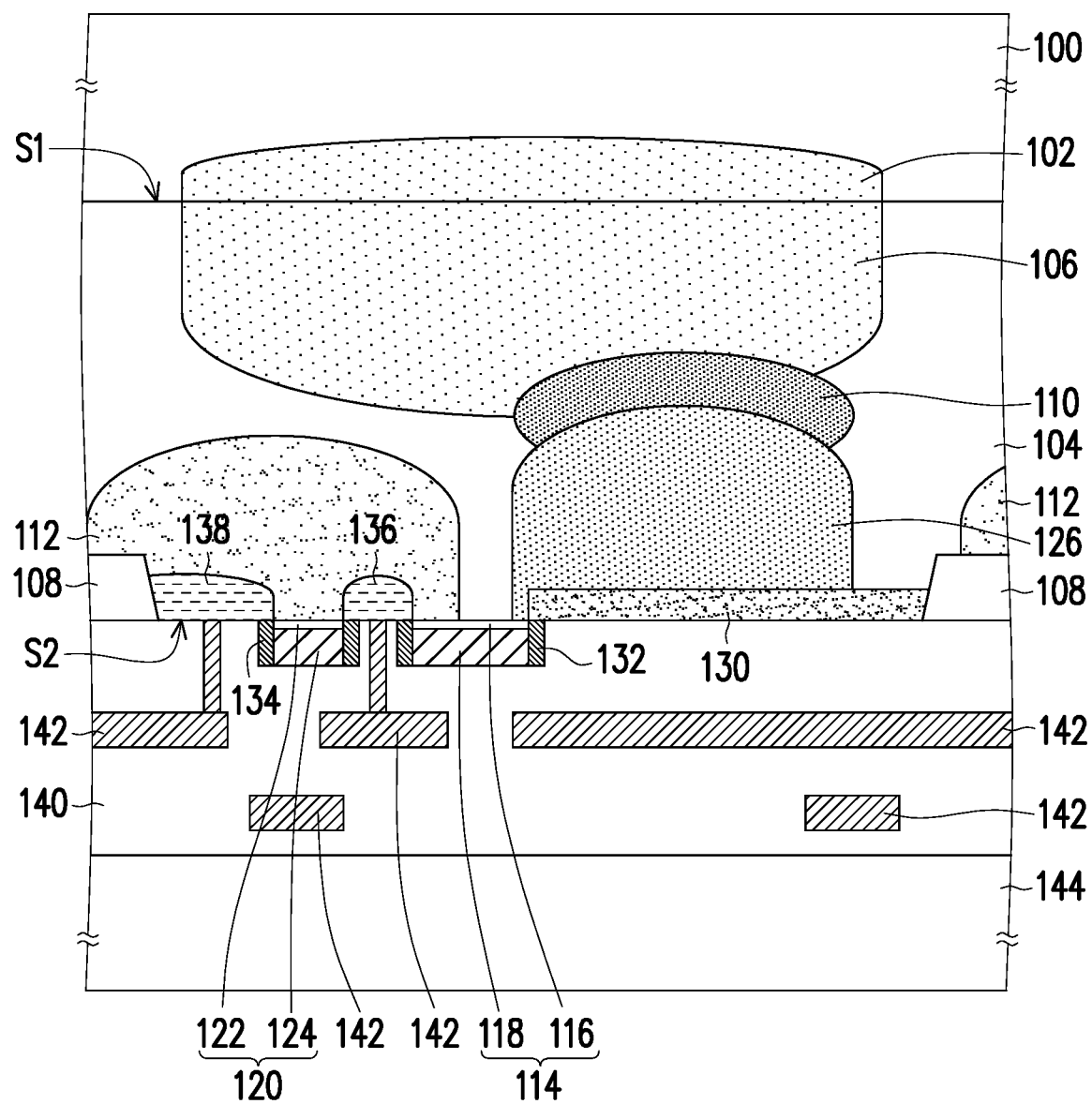

Please refer to FIG. 1F. The dielectric layer 140 may be bonded onto a substrate 144. In some embodiments, the substrate 144 may be a carrier wafer. The carrier wafer may be a semiconductor wafer, such as a silicon wafer, but the disclosure is not limited thereto.

Figure 1G:
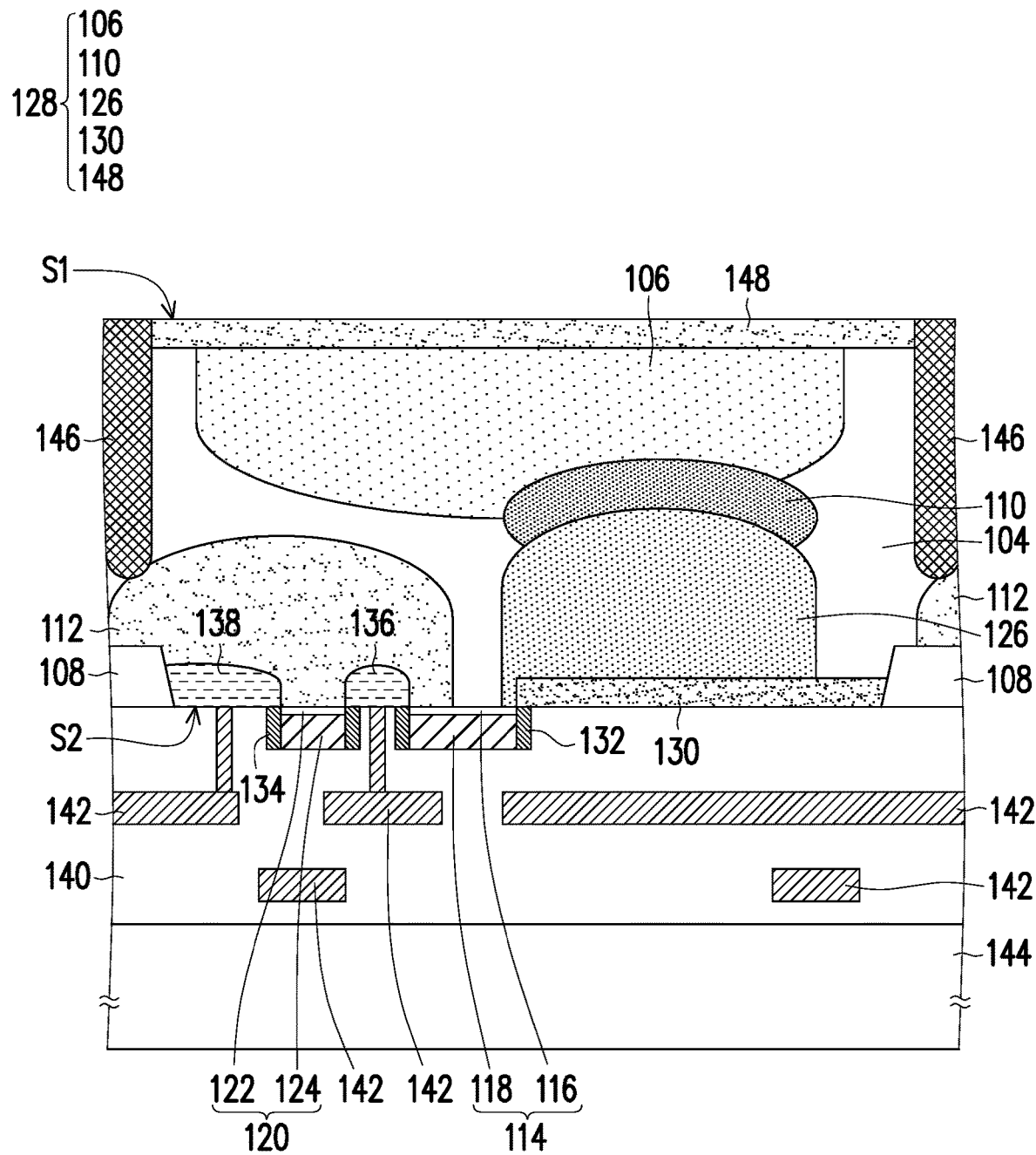

Please refer to FIG. 1G. The substrate 100 is removed. The removal method of the substrate 100 is, for example, a chemical mechanical polishing (CMP) method. Next, an isolation structure 146 may be formed in the semiconductor layer 104. The isolation structure 146 is, for example, a deep trench isolation (DTI) structure. The material of the isolation structure 146 is, for example, silicon oxide. The isolation structure 146 may be formed by a deep trench isolation process. In the embodiment, the isolation structure 146 and the isolation structure 108 may not be connected to each other, but the disclosure is not limited thereto. In some embodiments, the well region 112 may be connected to the isolation structure 146 and the isolation structure 108. In other embodiments, the isolation structure 146 and the isolation structure 108 may be connected to each other.

Next, a doped region 148 may be formed in the semiconductor layer 104. The doped region 148 may be used as a pinning layer. The doped region 148 may be located between the doped region 106 and the surface S1. The doped region 130 may be adjacent to the surface S1. The doped region 148 may be connected to the doped region 106. The doped region 148 may be of the first conductivity type (for example, the P type). The forming method of the doped region 148 may include an ion implantation method. In some embodiments, the doped region 148 may be formed by an ion implantation process and a laser annealing process. In some embodiments, the light sensing device 128 may further include the doped region 148.

Figure 1H:
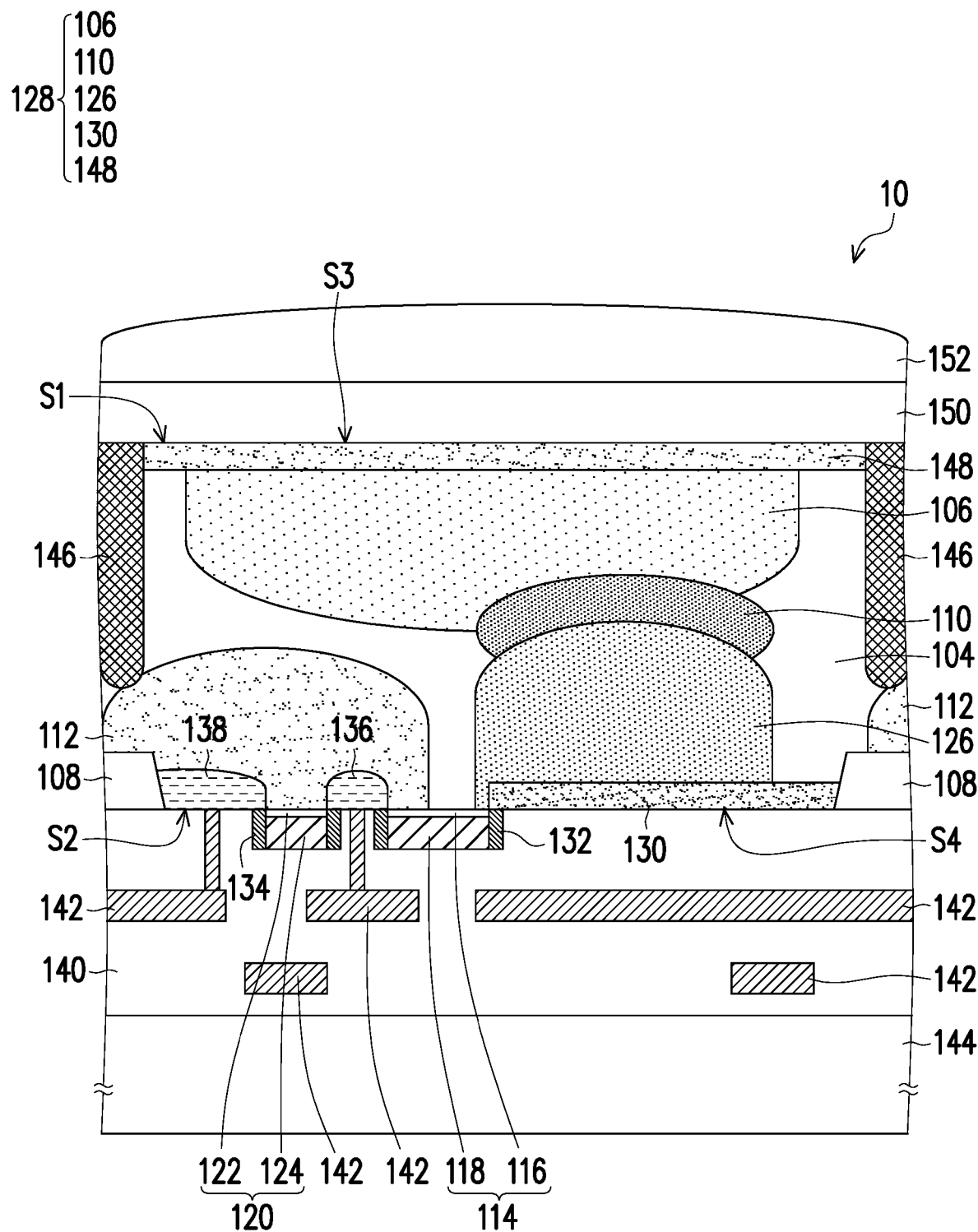

Please refer to FIG. 1H. A color filter layer 150 may be formed on the surface S1. The color filter layer 150 is, for example, a red filter layer, a green filter layer, or a blue filter layer. In some embodiments, the material of the color filter layer 150 is, for example, a photoresist material. Next, a microlens layer 152 may be formed on the color filter layer 150. In some embodiments, the material of the microlens layer 152 is, for example, silicon dioxide ($SiO_2$). In addition, the forming method of the color filter layer 150 and the microlens layer 152 is well known to persons skilled in the art, so the description thereof is omitted here.

Hereinafter, an image sensor 10 of the embodiment will be described with reference to FIG. 1H. In addition, although the forming method of the image sensor 10 is described by taking the above method as an example, the disclosure is not limited thereto.

Please refer to FIG. 1H. The backside illuminated image sensor 10 includes the semiconductor layer 104, the gate structure 114, and the light sensing device 128. The semiconductor layer 104 has the surface S1 and the surface S2 opposite to each other. The gate structure 114 is disposed on the surface S2. The gate structure 114 may include the dielectric layer 116 and the gate 118. The dielectric layer 116 is disposed on the surface S2. The gate 118 is disposed on the dielectric layer 116.

The light sensing device 128 is located in the semiconductor layer 104. In some embodiments, the light sensing device 128 may be an optical diode. The light sensing device 128 extends from the surface S1 to the surface S2. In some embodiments, the light sensing device 128 may include the doped region 106, the doped region 126, and the doped region 110. The doped region 106 is located in the semiconductor layer 104 and is adjacent to the surface S1. The doped region 126 is located in the semiconductor layer 104 and is adjacent to the surface S2. The doped region 110 is located in the semiconductor layer 104 and is connected between the doped region 106 and the doped region 126. The semiconductor layer 104 may be of the first conductivity type (for example, the P type). The doped region 106, the doped region 126, and the doped region 110 may be of the second conductivity type (for example, the N type).

In addition, the light sensing device 128 may further include at least one of the doped region 130 and the doped region 148. The doped region 130 is located in the semiconductor layer 104 and is located between the doped region 126 and the surface S2. The doped region 130 may be of the first conductivity type (for example, the P type). The doped region 148 is located in the semiconductor layer 104 and is located between the doped region 106 and the surface S1. The doped region 148 may be of the first conductivity type (for example, the P type).

In some embodiments, a portion of the light sensing device 128 may be located on one side of the gate structure 114. For example, the doped region 106, the doped region 126, the doped region 110, the doped region 130, and the doped region 148 may be located on one side of the gate structure 114. In some embodiments, a portion of the light sensing device 128 may be located directly under the entire gate structure 114. For example, the doped region 106 and the doped region 148 may be located directly under the entire gate structure 114. In some embodiments, a portion of the light sensing device 128 may extend from one side of the gate structure 114 to the other side of the gate structure 114. For example, the doped region 106 and the doped region 148 may extend from one side of the gate structure 114 to the other side of the gate structure 114.

In addition, the light sensing device 128 may have a surface S3 and a surface S4. The surface S3 may overlap with the surface S1. The surface S4 may overlap with the surface S2. In the case where the light sensing device 128 includes the doped region 148, the surface S3 of the light sensing device 128 may be a surface of the doped region 148. In the case where the light sensing device 128 does not include the doped region 148, the surface S3 of the light sensing device 128 may be a surface of the doped region 106. In the case where the light sensing device 128 includes the doped region 130, the surface S4 of the light sensing device 128 may be a surface of the doped region 130 and a portion of a surface of the doped region 126. In the case where the light sensing device 128 does not include the doped region 130, the surface S3 of the light sensing device 128 may be the surface of the doped region 126.

In addition, the backside illuminated image sensor 10 further includes the isolation structure 108, the well region 112, the gate structure 120, the spacer 132, the spacer 134, the doped region 136, the doped region 138, the dielectric layer 140, the interconnect structure 142, the substrate 144, the isolation structure 146, and at least one of the color filter layer 150 and the microlens layer 152. The isolation structure 108 is located in the semiconductor layer 104 and is adjacent to the surface S2. The well region 112 is located in the semiconductor layer 104. The well region 112 is located under a portion of the gate structure 114 and is located under the gate structure 120.

The gate structure 120 is located on the surface S2. The gate structure 114 is located between the gate structure 120 and the surface S4. The gate structure 120 and the gate structure 114 may be separated from each other. The gate structure 120 may include the dielectric layer 122 and the gate 124. The dielectric layer 122 is disposed on the surface S2. The gate 124 is disposed on the dielectric layer 122. In some embodiments, a portion of the light sensing device 128 may be located directly under the entire gate structure 114 and the entire gate structure 120. For example, the doped region 106 and the doped region 148 may be located directly under the entire gate structure 114 and the entire gate structure 120.

In addition, the spacer 132 is located on the sidewall of the gate structure 114. The spacer 134 is located on the sidewall of the gate structure 120. The doped region 136 is located in the semiconductor layer 104 between the gate structure 114 and the gate structure 120. The doped region 138 is located in the semiconductor layer 104 on one side of the gate structure 120. The dielectric layer 140 is disposed on the surface S2 and covers the gate structure 114 and the gate structure 120. The interconnect structure 142 is located in the dielectric layer 140. The substrate 144 may be bonded to the dielectric layer 140. The isolation structure 146 is located in the semiconductor layer 104 and is adjacent to the surface S1. The color filter layer 150 is disposed on the surface S1. The microlens layer 152 is disposed on the color filter layer 150.

In addition, the materials, forming methods, and functions of the components in the image sensor 10 have been described in detail in the above embodiment and will not be described here.

Based on the above embodiment, in the backside illuminated image sensor 10 and the manufacturing method thereof, since the light sensing device 128 extends from the surface S1 of the semiconductor layer 104 to the surface S2 of the semiconductor layer 104, the area of the light sensing device 128 and the photon collection region can be expanded. In this way, the full well capacity and the dynamic range of the backside illuminated image sensor 10 can be improved, thereby improving the image quality.

Figure 2:
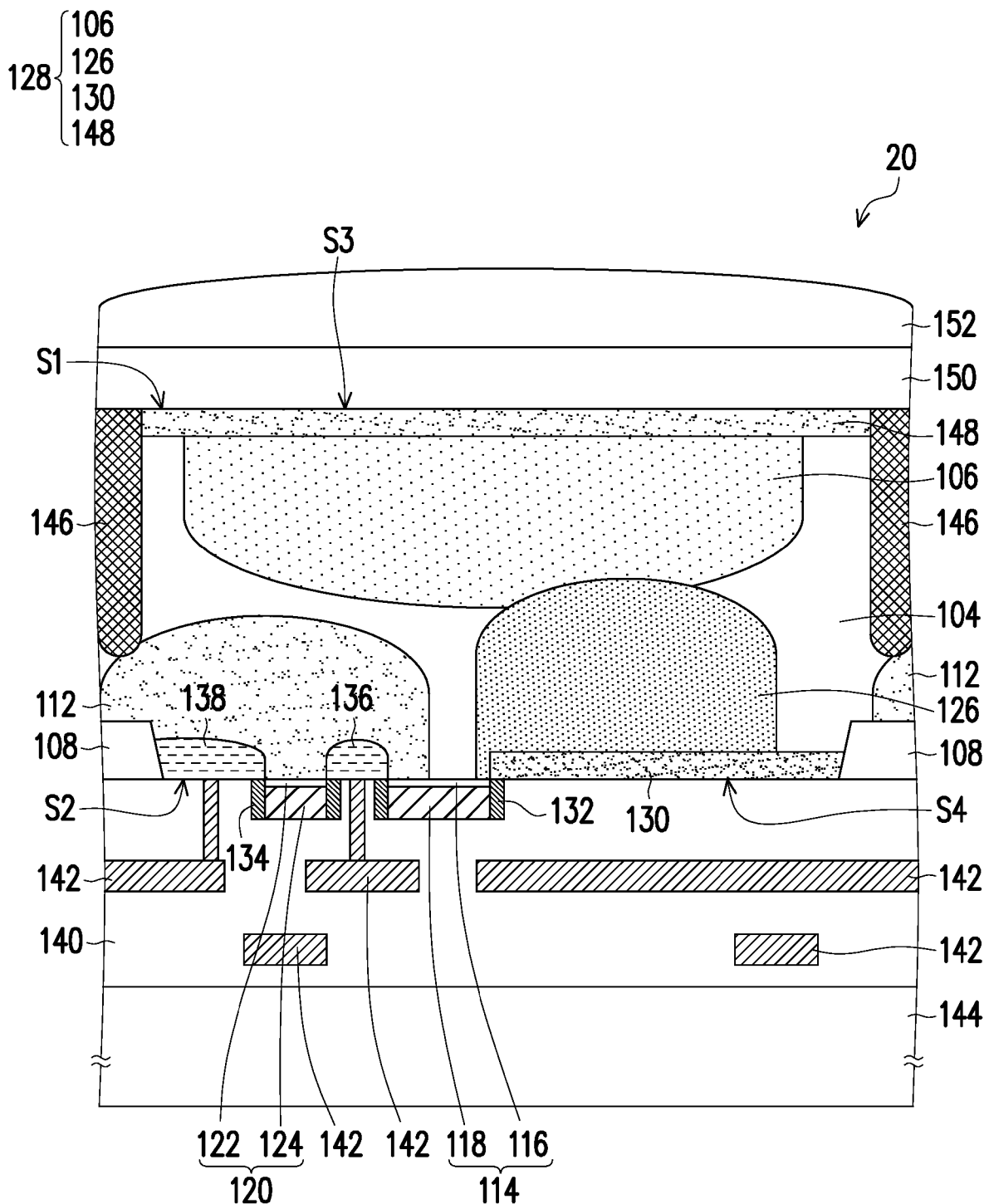
FIG. 2 is a cross-sectional view of a backside illuminated image sensor according to another embodiment of the disclosure.

FIG. 2 is a cross-sectional view of a backside illuminated image sensor according to another embodiment of the disclosure.

Please refer to FIG. 1H and FIG. 2. The difference between a backside illuminated image sensor 20 of FIG. 2 and the backside illuminated image sensor 10 of FIG. 1H is as follows. In the backside illuminated image sensor 20, the light sensing device 128 may include the doped region 106 and the doped region 126, but does not include the doped region 110. In addition, in the backside illuminated image sensor 20, the doped region 126 is connected to the doped region 106. That is, during the process of forming the light sensing device 128 of the backside illuminated image sensor 20, the step for forming the doped region 110 may be omitted, and the depth of at least one of the doped region 106 and the doped region 126 may be increased, so that the doped region 126 is connected to the doped region 106. In addition, in the backside illuminated image sensor 10 of FIG. 1H and the backside illuminated image sensor 20 of FIG. 2, the same or similar components are denoted by the same reference numerals, and the descriptions thereof are omitted.

Based on the above embodiment, in the backside illuminated image sensor 20 and a manufacturing method thereof, since the light sensing device 128 extends from the surface S1 of the semiconductor layer 104 to the surface S2 of the semiconductor layer 104, the area of the light sensing device 128 and the photon collection region can be expanded. In this way, the full well capacity and the dynamic range of the backside illuminated image sensor 20 can be improved, thereby improving the image quality.

In summary, since the backside illuminated image sensor and the manufacturing method thereof of the above embodiments can expand the area of the light sensing device and the photon collection region, the full well capacity and the dynamic range of the backside illuminated image sensor can be improved, thereby improving the image quality.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A backside illuminated image sensor, comprising:
    a semiconductor layer, having a first surface and a second surface opposite to each other;
    a first gate structure, disposed on the second surface;
    a light sensing device, located in the semiconductor layer, wherein the light sensing device extends from the first surface to the second surface, the light sensing device has a third surface and a fourth surface, the third surface overlaps with the first surface, the fourth surface overlaps with the second surface, and the light sensing device comprises:
        a first doped region, located in the semiconductor layer;
        a second doped region, located in the semiconductor layer; and
        a third doped region, located in the semiconductor layer and connected between the first doped region and the second doped region, wherein the semiconductor layer is of a first conductivity type, the first doped region, the second doped region, and the third doped region are of a second conductivity type, the first doped region is closer to the first surface than the second doped region, and the second doped region is closer to the second surface than the first doped region; and
    a second gate structure, located on the second surface, wherein the first gate structure is located between the second gate structure and the fourth surface,
    the first gate structure completely overlaps with the first doped region, and
    the second gate structure completely overlaps with the first doped region.

2. The backside illuminated image sensor according to claim 1, wherein a portion of the light sensing device is located on one side of the first gate structure.

3. The backside illuminated image sensor according to claim 1, wherein a portion of the light sensing device extends from one side of the first gate structure to other side of the first gate structure.

4. The backside illuminated image sensor according to claim 1, wherein the light sensing device further comprises:
    a fourth doped region, located in the semiconductor layer and located between the first doped region and the first surface, wherein the fourth doped region is of the first conductivity type.

5. The backside illuminated image sensor according to claim 1, wherein the light sensing device further comprises:
    a fourth doped region, located in the semiconductor layer and located between the second doped region and the second surface, wherein the fourth doped region is of the first conductivity type.

6. The backside illuminated image sensor according to claim 1, further comprising:
    a color filter layer, disposed on the first surface; and
    a microlens layer, disposed on the color filter layer.

7. The backside illuminated image sensor according to claim 1, wherein a material of the semiconductor layer comprises doped epitaxial silicon.

8. A manufacturing method of a backside illuminated image sensor, comprising:
    providing a semiconductor layer, wherein the semiconductor layer has a first surface and a second surface opposite to each other;
    forming a first gate structure on the second surface;
    forming a light sensing device in the semiconductor layer, wherein the light sensing device extends from the first surface to the second surface, the light sensing device has a third surface and a fourth surface, the third surface overlaps with the first surface, the fourth surface overlaps with the second surface, and the light sensing device comprises:
        a first doped region, located in the semiconductor layer;
        a second doped region, located in the semiconductor layer; and
        a third doped region, located in the semiconductor layer and connected between the first doped region and the second doped region, wherein the semiconductor layer is of a first conductivity type, the first doped region, the second doped region, and the third doped region are of a second conductivity type, the first doped region is closer to the first surface than the second doped region, and the second doped region is closer to the second surface than the first doped region; and
    forming a second gate structure on the second surface, wherein the first gate structure is located between the second gate structure and the fourth surface,
    the first gate structure completely overlaps with the first doped region, and
    the second gate structure completely overlaps with the first doped region.

9. The manufacturing method of the backside illuminated image sensor according to claim 8, wherein a forming method of the semiconductor layer and the first doped region comprises:
  providing a substrate;
  forming a fourth doped region in the substrate, wherein the fourth doped region is of the second conductivity type;
  forming the semiconductor layer on the substrate; and
  performing a thermal process to diffuse a dopant in the fourth doped region into the semiconductor layer to form the first doped region.

* * * * *